(12) United States Patent
Smith et al.

(10) Patent No.: US 8,860,174 B2
(45) Date of Patent: Oct. 14, 2014

(54) RECESSED ANTIFUSE STRUCTURES AND METHODS OF MAKING THE SAME

(75) Inventors: Casey Smith, Salt Lake, UT (US);
Jasper S. Gibbons, Boise, ID (US);
Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 11/495,805

(22) Filed: Jul. 28, 2006

(65) Prior Publication Data

US 2007/0262415 A1 Nov. 15, 2007

Related U.S. Application Data

(63) Continuation-in-part of application No. 11/432,442, filed on May 11, 2006, now abandoned, and a continuation-in-part of application No. 11/432,270, filed on May 11, 2006, now Pat. No. 8,008,144.

(51) Int. Cl.
*H01L 29/00* (2006.01)
*H01L 21/8234* (2006.01)
*H01L 29/66* (2006.01)

(52) U.S. Cl.
CPC .. *H01L 21/823425* (2013.01); *H01L 21/82345* (2013.01); *H01L 29/66621* (2013.01)
USPC ........... 257/529; 257/259; 257/281; 257/530; 438/129

(58) Field of Classification Search
USPC .......... 257/530, 368; 438/197, 585, 586, 595, 438/596
See application file for complete search history.

(56) References Cited

U.S. PATENT DOCUMENTS

| 4,636,834 | A |   | 1/1987  | Shepard |
|-----------|---|---|---------|---------|
| 4,714,519 | A | * | 12/1987 | Pfiester .................. 438/304 |
| 5,013,680 | A |   | 5/1991  | Lowrey et al. |
| 5,122,848 | A |   | 6/1992  | Lee et al. |
| 5,547,890 | A |   | 8/1996  | Tseng |
| 5,583,065 | A |   | 12/1996 | Miwa et al. |
| 5,619,057 | A | * | 4/1997  | Komatsu .................. 257/382 |
| 5,714,412 | A |   | 2/1998  | Liang et al. |
| 5,909,618 | A |   | 6/1999  | Forbes et al. |
| 5,937,280 | A |   | 8/1999  | Wen |

(Continued)

FOREIGN PATENT DOCUMENTS

| EP | 1772898 A1 | 4/2007 |
|----|------------|--------|
| EP | 1801856 A1 | 6/2007 |

(Continued)

OTHER PUBLICATIONS

Supplementary European Search Report for EP09825209, dated Nov. 7, 2012, 9 pages.

(Continued)

*Primary Examiner* — Steven Loke
*Assistant Examiner* — David Goodwin
(74) *Attorney, Agent, or Firm* — Traskbritt

(57) ABSTRACT

Antifuses having two or more materials with differing work function values may be fabricated as recessed access devices and spherical recessed access devices for use with integrated circuit devices and semiconductor devices. The use of materials having different work function values in the fabrication of recessed access device antifuses allows the breakdown areas of the antifuse device to be customized or predicted.

20 Claims, 12 Drawing Sheets

(56) References Cited

U.S. PATENT DOCUMENTS

| | | | |
|---|---|---|---|
| 5,941,701 A * | 8/1999 | Moran et al. | 433/1 |
| 5,953,614 A | 9/1999 | Liu et al. | |
| 5,960,270 A | 9/1999 | Misra et al. | |
| 5,963,469 A | 10/1999 | Forbes | |
| 5,977,579 A | 11/1999 | Noble | |
| 6,072,209 A | 6/2000 | Noble et al. | |
| 6,090,692 A | 7/2000 | Song et al. | |
| 6,121,100 A | 9/2000 | Andideh et al. | |
| 6,130,453 A | 10/2000 | Mei et al. | |
| 6,150,687 A | 11/2000 | Noble et al. | |
| 6,187,619 B1 | 2/2001 | Wu | |
| 6,191,470 B1 | 2/2001 | Forbes et al. | |
| 6,215,149 B1 | 4/2001 | Lee | |
| 6,225,669 B1 | 5/2001 | Long et al. | |
| 6,259,142 B1 | 7/2001 | Dawson et al. | |
| 6,294,434 B1 | 9/2001 | Tseng | |
| 6,300,177 B1 | 10/2001 | Sundaresan et al. | |
| 6,313,046 B1 | 11/2001 | Juengling et al. | |
| 6,343,114 B1 * | 1/2002 | Chea, Jr. | 379/29.01 |
| 6,373,114 B1 * | 4/2002 | Jeng et al. | 257/413 |
| 6,383,879 B1 * | 5/2002 | Kizilyalli et al. | 438/303 |
| 6,476,444 B1 | 11/2002 | Min | |
| 6,498,062 B2 | 12/2002 | Durcan et al. | |
| 6,534,402 B1 | 3/2003 | Liao | |
| 6,534,837 B1 | 3/2003 | Bai et al. | |
| 6,548,870 B1 | 4/2003 | Lee | |
| 6,552,401 B1 | 4/2003 | Dennison | |
| 6,562,713 B1 | 5/2003 | Belyansky et al. | |
| 6,566,708 B1 | 5/2003 | Grover | |
| 6,607,958 B2 | 8/2003 | Suguro | |
| 6,630,720 B1 | 10/2003 | Maszara et al. | |
| 6,653,698 B2 | 11/2003 | Lee et al. | |
| 6,696,746 B1 | 2/2004 | Farrar et al. | |
| 6,841,834 B2 | 1/2005 | Nowak | |
| 6,844,578 B2 | 1/2005 | Harada et al. | |
| 6,844,591 B1 | 1/2005 | Tran | |
| 6,924,190 B2 | 8/2005 | Dennison | |
| 6,939,765 B2 | 9/2005 | Kim et al. | |
| 6,956,263 B1 | 10/2005 | Mistry | |
| 6,963,108 B1 | 11/2005 | Kang et al. | |
| 7,029,966 B2 | 4/2006 | Amos et al. | |
| 7,045,406 B2 | 5/2006 | Huotari et al. | |
| 7,071,043 B2 | 7/2006 | Tang et al. | |
| 7,122,425 B2 | 10/2006 | Chance et al. | |
| 7,141,858 B2 | 11/2006 | Polishchuk et al. | |
| 7,148,100 B2 | 12/2006 | Kim et al. | |
| 7,202,535 B2 | 4/2007 | Goldbach et al. | |
| 7,214,621 B2 | 5/2007 | Nejad et al. | |
| 7,229,873 B2 | 6/2007 | Colombo et al. | |
| 7,244,659 B2 | 7/2007 | Tang et al. | |
| 7,262,089 B2 | 8/2007 | Abbott et al. | |
| 7,282,401 B2 | 10/2007 | Juengling | |
| 7,285,812 B2 | 10/2007 | Tang et al. | |
| 7,316,950 B2 | 1/2008 | Park et al. | |
| 7,319,255 B2 | 1/2008 | Hwang et al. | |
| 7,332,433 B2 | 2/2008 | Choi et al. | |
| 7,349,232 B2 | 3/2008 | Wang et al. | |
| 7,384,849 B2 | 6/2008 | Parekh et al. | |
| 7,408,806 B2 | 8/2008 | Park et al. | |
| 7,456,469 B2 * | 11/2008 | Yamazaki | 257/330 |
| 7,470,588 B2 * | 12/2008 | Cho et al. | 438/272 |
| 7,563,677 B2 | 7/2009 | Yoo et al. | |
| 7,564,061 B2 | 7/2009 | Mimura | |
| 7,666,727 B2 * | 2/2010 | Doyle et al. | 438/197 |
| 7,709,380 B2 | 5/2010 | Veloso | |
| 7,824,986 B2 | 11/2010 | Gurtej et al. | |
| 7,875,919 B2 | 1/2011 | Booth, Jr. et al. | |
| 7,902,597 B2 | 3/2011 | Lee et al. | |
| 7,968,463 B2 | 6/2011 | Nakagawa et al. | |
| 8,034,687 B2 | 10/2011 | Gurtej et al. | |
| 8,524,561 B2 | 9/2013 | Sandhu et al. | |
| 2002/0028541 A1 | 3/2002 | Lee et al. | |
| 2002/0106858 A1 | 8/2002 | Zheng et al. | |
| 2002/0132473 A1 | 9/2002 | Chiang et al. | |
| 2002/0146878 A1 | 10/2002 | Ohnakado | |
| 2003/0203566 A1 | 10/2003 | McQueen et al. | |
| 2004/0212024 A1 | 10/2004 | Oh et al. | |
| 2005/0048729 A1 | 3/2005 | Yoon et al. | |
| 2005/0139926 A1 | 6/2005 | Shimizu et al. | |
| 2005/0202632 A1 | 9/2005 | Ding | |
| 2005/0233533 A1 | 10/2005 | Alshareef et al. | |
| 2006/0017099 A1 | 1/2006 | Paik | |
| 2006/0046354 A1 * | 3/2006 | Kreipl | 438/132 |
| 2006/0084247 A1 | 4/2006 | Liu | |
| 2006/0131636 A1 | 6/2006 | Jeon et al. | |
| 2006/0141728 A1 | 6/2006 | Pawlak | |
| 2006/0157796 A1 | 7/2006 | Kim et al. | |
| 2007/0026595 A1 | 2/2007 | Fukutome et al. | |
| 2007/0077713 A1 | 4/2007 | Ha et al. | |
| 2007/0148886 A1 | 6/2007 | Veloso | |
| 2007/0221970 A1 | 9/2007 | Kadoshima et al. | |
| 2007/0262395 A1 | 11/2007 | Gibbons et al. | |
| 2007/0262415 A1 * | 11/2007 | Smith et al. | 257/530 |
| 2007/0264771 A1 | 11/2007 | Ananthan et al. | |
| 2008/0017921 A1 | 1/2008 | Jung | |
| 2008/0099801 A1 | 5/2008 | Lee et al. | |
| 2008/0146012 A1 | 6/2008 | Lin et al. | |
| 2008/0230844 A1 | 9/2008 | Yu et al. | |
| 2008/0261366 A1 | 10/2008 | Jeon et al. | |
| 2009/0230463 A1 | 9/2009 | Carter et al. | |

FOREIGN PATENT DOCUMENTS

| | | |
|---|---|---|
| EP | 10801856 A1 | 6/2007 |
| EP | 2342740 A2 | 7/2011 |
| JP | 2006013332 A | 1/2006 |
| WO | 2004/107421 A1 | 12/2004 |

OTHER PUBLICATIONS

International Search Report for International Application No. PCT/US2009/061823 mailed May 17, 2010, 3 pages.

Spee et al., Low Temperature Deposition of TiN Ceramic Material by Metal Organic and/or Plasma Enhanced CVD, Journal DE Physique IV, Jun. 1995;5:C5-719-C5-734.

Zamouche et al., Investigation of Fast Diffusing Impurities in Silicon by a Transient Ion Drift Method, Appl. Phys. Lett., Jan. 1995;66(5):631-633.

* cited by examiner

RECESSED ANTIFUSE STRUCTURES AND METHODS OF MAKING THE SAME

CROSS-REFERENCE TO RELATED APPLICATIONS

This application is a continuation-in-part of U.S. patent application Ser. No. 11/432,442, entitled "MEMORY CELL ACCESS DEVICES AND METHODS OF MAKING THE SAME," filed May 11, 2006, now abandoned, and a continuation-in-part of U.S. patent application Ser. No. 11/432,270, entitled "DUAL WORK FUNCTION RECESSED ACCESS DEVICE AND METHODS OF FORMING," filed May 11, 2006, now U.S. Pat. No. 8,008,144, issued Aug. 30, 2011, the disclosures of each of which are incorporated herein by reference in their entirety.

BACKGROUND OF THE INVENTION

1. Field of the Invention

The invention relates to antifuse devices and, more particularly, to recessed gate dielectric antifuse devices and methods of making the same.

2. State of the Art

Antifuse devices are commonly used to permanently program integrated circuit (IC) devices and other electrical components. Semiconductor integrated circuit devices such as flash memory, erasable programmable read-only memory (EPROM), electrically erasable programmable read-only memory (EEPROM), dynamic random access memory (DRAM), static random access memory (SRAM), and other random access memory devices typically employ the use of antifuses to program the memory or to provide access to redundant circuitry in the memory devices. For example, memory devices and other integrated circuit devices frequently include redundant circuitry linked to operational circuitry by one or more antifuse devices. In those instances where the operational circuitry fails or is defective, one or more antifuses may be programmed to bypass the defective circuitry or to utilize available redundant circuitry in place of the defective circuitry. The use of antifuses to program conventional integrated circuit devices and to select circuitry to be used on an integrated circuit device is well known.

Gate-oxide antifuses are typically formed from conventional planar access devices (PAD) such as Metal Oxide Semiconductor Field Effect Transistors (MOSFET). MOSFETs generally include a doped polysilicon gate, a channel conduction region, and source/drain regions formed by diffusion of dopants in silicon substrates. A voltage difference may be generated between the doped polysilicon gate and the channel conduction region or the source/drain regions of the MOSFET. The voltage difference may be used to program the antifuse device. For example, antifuses have a high resistance; when a high voltage exceeding the capacity of the antifuse is applied across the antifuse, the gate-oxide of the antifuse breaks down, creating an electrically conductive path through the antifuse. The breakdown of an antifuse may include a soft breakdown, where the antifuse has a high fuse resistance, or a hard breakdown, where the antifuse has a low fuse resistance.

In an attempt to improve antifuse devices and the use of antifuses with integrated circuit devices, new antifuse structures are being developed. For example, antifuses formed from recessed access devices (RAD), as opposed to the traditional planar access devices (PAD), are being used with high-density memory cells. Recessed access device antifuses are described in U.S. patent application Ser. No. 10/933,161, now U.S. Pat. No. 7,795,094, issued Sep. 14, 2010, entitled "RECESSED GATE DIELECTRIC ANTIFUSE," and published as US 2006/0046354, the disclosure of which is incorporated herein by reference in its entirety. The use of recessed access devices as antifuses allows the formation of smaller antifuses with integrated circuits and semiconductor devices. This is especially desirable, as the design of integrated circuit devices require smaller feature sizes and increased circuit densities.

Although some strides have been made to improve antifuse technology for use with new integrated circuit devices, further enhancements in antifuse technology are desired. In particular, as higher-density integrated circuit devices are developed, smaller antifuse devices are required. Improved reliability in antifuse devices is also desirable. The ability to control the initial breakdown point of an antifuse device is also desirable.

BRIEF DESCRIPTION OF THE DRAWINGS

While the specification concludes with claims particularly pointing out and distinctly claiming that which is regarded as the present invention, this invention can be more readily understood and appreciated by one of ordinary skill in the art from the following description of the invention when read in conjunction with the accompanying drawings in which:

DETAILED DESCRIPTION OF THE ILLUSTRATED EMBODIMENTS

Figure 1:
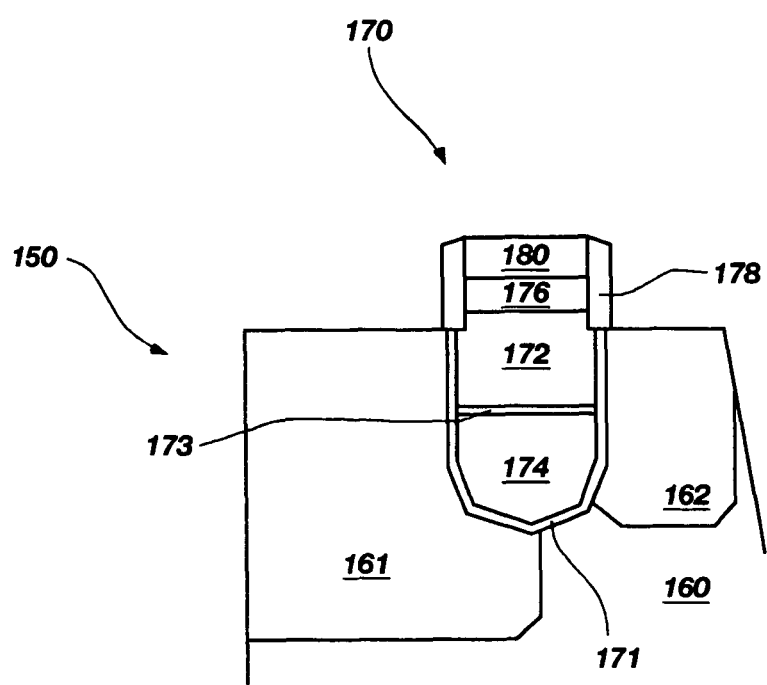
FIG. 1 illustrates a cross-sectional view of a recessed access device structure that may be used as an antifuse according to embodiments of the invention.

According to embodiments of the invention, antifuses for use with integrated circuits and semiconductor devices may be formed utilizing recessed access devices and spherical recessed access devices. The antifuses may include two or more materials having different work function values. The work function values of the two or more materials used with the antifuses may differ by about 0.2 eV or more. The difference in work function values of the materials used to form the antifuses of embodiments of the invention allows the antifuses to be customized such that the breakdown areas of the antifuses may be controlled.

According to particular embodiments of the invention, a recessed access device having two or more materials with different work function values layered on top of each other may be used as an antifuse device with integrated circuitry and semiconductor devices. The layered materials may be separated by one or more barrier layers for preventing migration of dopants from one material to another during integrated circuit and semiconductor fabrication processes. In some embodiments, the recessed access device having two or more material layers may be a spherical recessed access device. The intersection of each of the two or more layers of materials in the recessed access device provides a likely area for antifuse breakdown. Utilizing the likely breakdown area, the breakdown of the antifuse may be controlled or tailored for a desired function or for use with a desired integrated circuit or semiconductor device.

In still other embodiments of the invention, a recessed access device having two or more materials aligned vertically in a trench defining the recessed access device may have different work function values. A first material may be positioned on the sidewalls of the recessed access device with one or more additional materials filling the remainder of the recessed access device and at least partially surrounded by the first material. The difference in the work function values of the first material and the one or more additional materials may be about 0.2 eV or more. In some embodiments, the recessed access device may be a spherical recessed access device. The intersection of each of the two or more layers of materials in the recessed access device provides a likely area for antifuse breakdown. Utilizing the likely breakdown area, the breakdown of the antifuse may be controlled or tailored for a desired function or for use with a desired integrated circuit or semiconductor device.

According to embodiments of the invention, an antifuse may be formed from a recessed access device (RAD) structure or a spherical recessed access device (SRAD) structure. The RAD structure or the SRAD structure may be formed, in part, from two or more materials having different work functions. The intersections of the different work function materials in the RAD structures or the SRAD structures provide a convenient location for antifuse breakdown. In addition, the partial spherical shape of SRAD structures provides additional breakdown locations for antifuses formed from such structures.

An antifuse device 150 according to particular embodiments of the invention is illustrated in FIG. 1. The antifuse device 150 may include one or more recessed access device (RAD) antifuses 170. A RAD antifuse 170 may be formed in a trench of a semiconductor substrate 160 and may be positioned between active areas 162, such as between laterally spaced source and drain regions of memory devices, or between source and drain regions and shallow trench isolation (STI) regions 161 as illustrated in FIG. 1. The trench in the semiconductor substrate 160 may be lined with an oxide 171 similar to the gate-oxide linings used with conventional RAD structures. The RAD antifuse 170 may include a first material 172 overlying a second material 174 in the trench of the semiconductor substrate 160. The first material 172 and the second material 174 may be separated by a barrier 173 as illustrated in FIG. 1. The RAD antifuse 170 may also include a gate overlying the first material 172. The gate may include a strap 176 overlying the first material 172 and an insulator cap 180 overlying the strap 176. In other embodiments, the RAD antifuse 170 may include an insulator cap 180 without a strap 176. Sidewall spacers 178 may also be formed with the RAD antifuse 170.

According to embodiments of the invention, the second material 174 of the RAD antifuse 170 may be formed of a material having a higher work function than the first material 172. For example, in an n-channel device, the second material 174 may include a p-type doped polysilicon material and the first material 172 may include an n-type doped polysilicon material. Thus, the second material 174 would exhibit a higher work function than that of the first material 172 in the n-channel device. In a p-channel device, the second material 174 may include an n-type doped polysilicon material and the first material 172 may include a p-type doped polysilicon material. Other materials having differing work functions may also be used to form a RAD antifuse 170 according to embodiments of the invention.

Materials used to form the first material 172 and second material 174 may include materials such as polysilicon, doped polysilicon, metals, and metal alloys.

A barrier 173 may be positioned between the first material 172 and the second material 174 in the RAD antifuse 170 to prevent cross-diffusion of dopants in the first material 172 and second material 174. The barrier 173 may also provide an ohmic contact between the two materials if desired. The barrier 173 may include metals such as tungsten, aluminum, copper, or titanium. In some embodiments, the barrier 173 may be formed from one or more metal layers, including similar or dissimilar metals. In other embodiments, the barrier 173 may provide an electrical connection or conduction between the first material 172 and the second material 174. The barrier 173 may also act as an insulator or may be formed from conductive material, insulative material, or conductive and insulative material.

In those particular embodiments of the invention where a strap 176 is formed as part of the RAD antifuse 170, the strap 176 may be formed of a conductive material, such as a metal, a conductive silicon material, a doped silicon material, or another conductor. In other embodiments, the strap 176 need not be conductive.

An insulator cap 180 incorporated with a RAD antifuse 170 may include any insulating material that may be used as an insulating layer for conventional planar or recessed access devices. For instance, the insulator cap 180 may be formed of a nitride or an oxide such as silicon nitride or silicon dioxide.

Similarly, sidewall spacers 178 may be formed from materials used to form spacers 178 with conventional planar or recessed access devices. For example, the sidewall spacers 178 may include materials such as silicon dioxide or other oxides, silicon nitride, or other nitrides, or silicon oxynitride. In some instances, the sidewall spacers 178 and the insulator cap 180 may be formed of the same material.

Figure 2A:
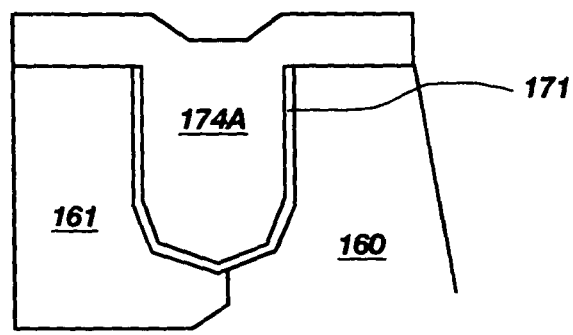
FIGS. 2A-2E illustrate cross-sectional views of various process steps in the fabrication the recessed access device antifuse illustrated in FIG. 1 according to embodiments of the invention.
Figure 2B:
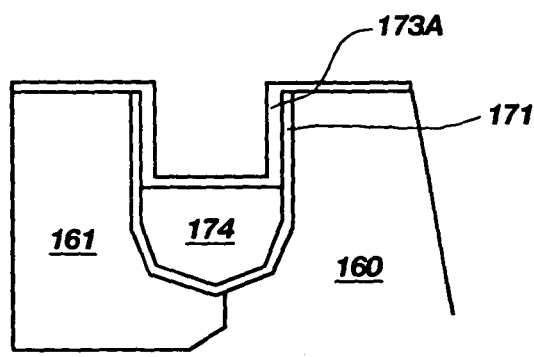
Figure 2C:
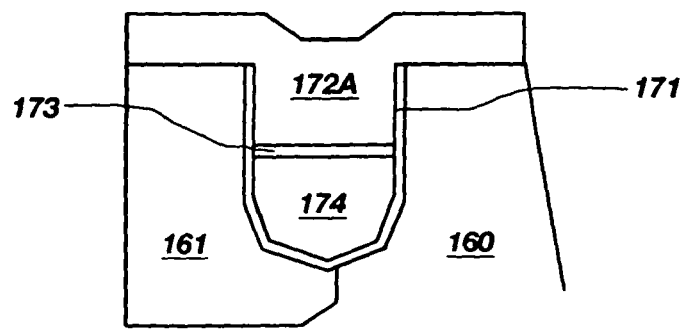
Figure 2D:
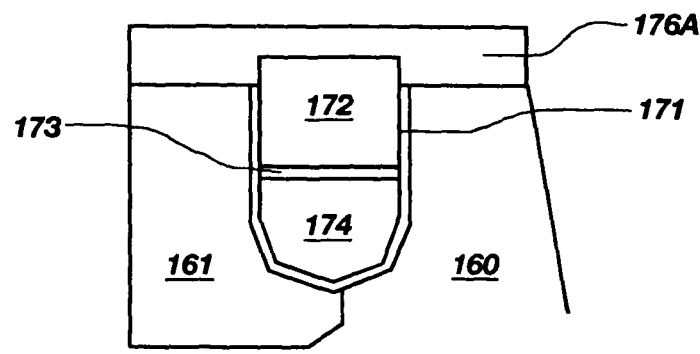
Figure 2E:
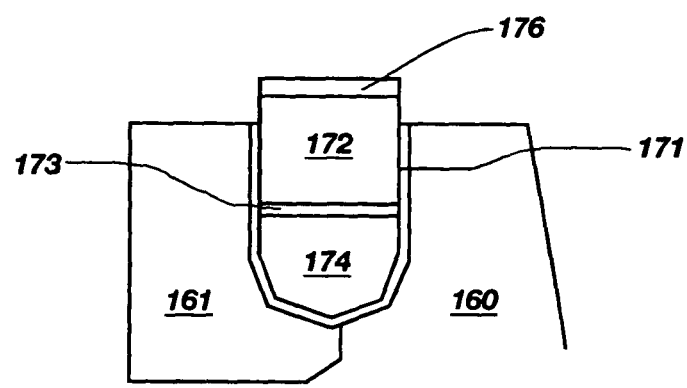

The RAD antifuse 170 of embodiments of the invention may be produced using fabrication processes used to form conventional RAD structures in semiconductor devices and particularly memory devices. For example, the RAD antifuse 170 illustrated in FIG. 1 may be formed using conventional CMOS or memory device fabrication processes similar to the processes illustrated in FIGS. 2A-2E. As illustrated in FIG. 2A, a semiconductor substrate 160 having one or more trenches formed therein may be provided. The one or more trenches may be formed next to or in part of a shallow trench isolation region 161 or between active areas 162 in the semiconductor substrate 160, or regions where active areas 162 are to be formed. Oxide 171 may be grown or deposited in a trench using conventional oxide formation processes. A second material layer 174A may be deposited over the semiconductor substrate 160 and in the trenches and may be doped using conventional processes. Masking and/or etching of the second material layer 174A may be performed to form the second material 174 in the bottoms of the trenches of the semiconductor substrate 160 as illustrated in FIG. 2B. A barrier layer 173A may be deposited over the second material 174 and the semiconductor substrate 160. Masking and/or etching of the barrier layer 173A may form a barrier 173 over the second material 174 in the bottom of the trenches as illustrated in FIG. 2C. A first material layer 172A may be deposited over the semiconductor substrate 160 and in the trenches over the barrier 173 as illustrated in FIG. 2C. Masking and/or etching of the first material layer 172A may form the first material 172 as illustrated in FIG. 2D. The masking and/or etching of the first material layer 172A may be performed such that a portion of the first material 172 extends above a surface of the semiconductor substrate 160. An optional strap material 176A deposited over the first material 172 may be masked and/or etched to form a strap 176 over the first material 172 as illustrated in FIG. 2E. Conventional masking, etching, doping, and deposition processes may be used to complete the formation of the RAD antifuse 170 illustrated in FIG. 1, including the formation of insulator caps 180 and sidewall spacers 178 if desired, and the doping of the active areas 162 where required.

Although particular methods for forming the RAD antifuse 170 of certain embodiments of the invention are illustrated in FIGS. 2A-2E, it is understood that other methods and processes may also be used to fabricate RAD antifuses 170 according to embodiments of the invention.

Figure 3:
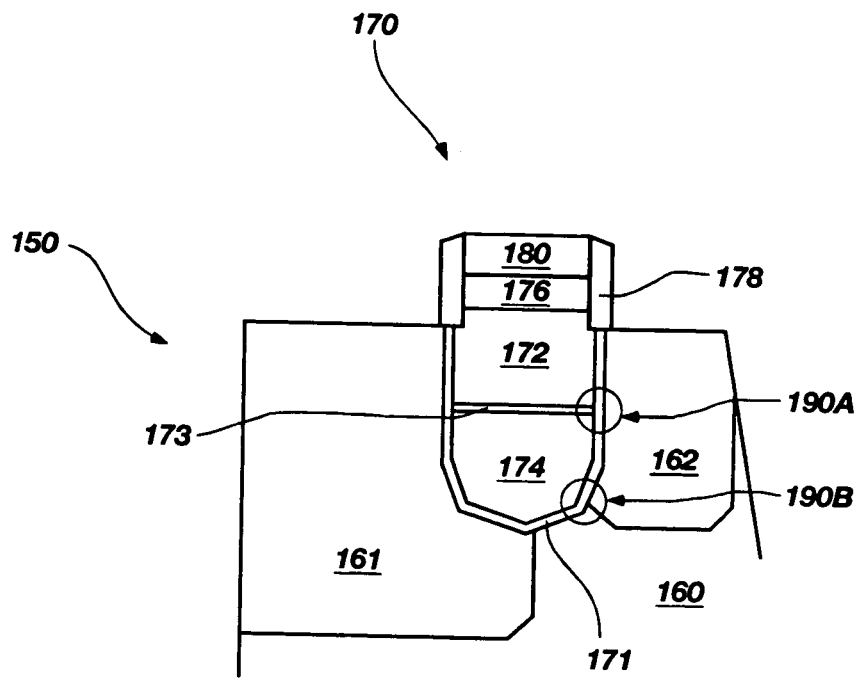
FIG. 3 illustrates a cross-sectional view of the recessed access device antifuse illustrated in FIG. 1 showing breakdown areas according to embodiments of the invention.

The utilization of multi-work function materials to fabricate the RAD antifuses 170 according to embodiments of the invention may provide improved breakdown areas 190A, 190B in the RAD antifuse 170 as compared to traditional recessed access device antifuse structures, such as those described in the afore-mentioned U.S. patent application Ser. No. 10/933,161, entitled "RECESSED GATE DIELECTRIC ANTIFUSE," and published as US 2006/0046354, now U.S. Pat. No. 7,795,095, issued Sep. 14, 2010. As illustrated in FIG. 3, the RAD antifuse 170 of FIG. 1 may include one or more likely breakdown areas 190A, 190B represented by the circled areas in FIG. 3. One of the likely breakdown areas 190A occurs at the intersection between the first material 172 and the second material 174 with the oxide 171 layer or at the intersection of the two materials with the barrier 173 and the oxide material 171. Breakdown area 190A is a likely breakdown area for the RAD antifuse 170 because of the disruption in the oxide 171 that occurs at the intersection of the first material 172 and the second material 174 with or without a barrier 173. A second likely breakdown area 190B occurs at the intersection between the semiconductor substrate 160, the active area 162, and the oxide 171.

The curvature of the bottom of RAD antifuse 170 in the trench of the semiconductor substrate 160 may also enhance a generated electric field in the RAD antifuse 170, contributing to improved breakdown of the RAD antifuse 170.

Use of a RAD antifuse 170 in an integrated circuit device or semiconductor device may allow the customization of the antifuse positioning to produce a breakdown of the antifuse in a desired region of the integrated circuit device or semiconductor device.

Figure 4:
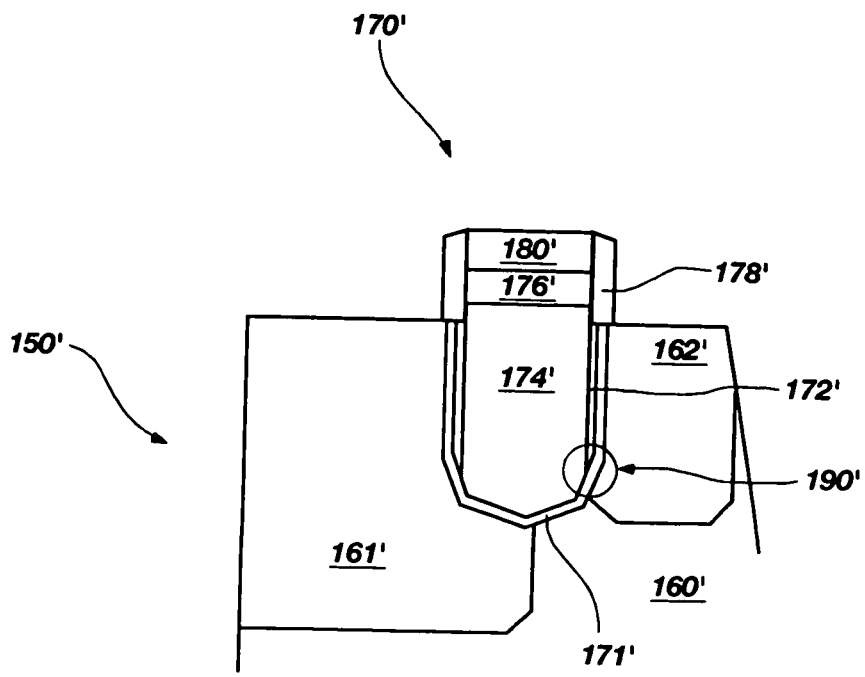
FIG. 4 illustrates a cross-sectional view of a recessed access device antifuse that may be used as an antifuse according to embodiments of the invention.

According to other embodiments of the invention, an antifuse device 150' having one or more RAD antifuses 170' with two or more materials having different work functions may include a RAD antifuse 170' having a first material 172' positioned along at least a portion of the sidewalls of the RAD antifuse 170' and a second material 174' at least partially surrounded by the first material 172' as illustrated in FIG. 4. As with other embodiments of the invention, trenches in the semiconductor substrate 160' may include an oxide 171' on the sidewalls and in the bottom of the trenches. The first material 172' may be positioned along at least a portion of the oxide 171' layer and the second material 174' may be positioned in an interior portion of the trench with respect to the first material 172', or within an opening in the first material 172', as illustrated. In some embodiments, a barrier layer (not shown) may be formed between the first material 172' and the second material 174'. The RAD antifuse 170' may also include a gate overlying the first material 172' and second material 174'. The gate may include a strap 176' overlying the first material 172' and second material 174' and an insulator cap 180' overlying the strap 176'. Sidewall spacers 178' may also be formed with the RAD antifuse 170'. The RAD antifuse 170' may be positioned between active areas 162', such as source and drain regions of memory devices, or between a source or drain region active area 162' and a shallow trench isolation (STI) region 161' as illustrated in FIG. 4.

For the RAD antifuse 170' illustrated in FIG. 4, the most likely point of breakdown in the RAD antifuse 170' is located at the intersection of the first material 172' and the second material 174' with the oxide 171', as illustrated by a circled breakdown area 190'. When a voltage sufficient to break the RAD antifuse 170' is applied to the RAD antifuse 170', the breakdown of the RAD antifuse 170' will most likely occur within or near the breakdown area 190'. The breakdown area 190' is a likely breakdown point for the RAD antifuse 170' because of the disruption of the oxide 171' due to the convergence of the first material 172' and the second material 174' within the breakdown area 190'.

According to embodiments of the invention, the second material 174' of the RAD antifuse 170' may be formed of a material having a higher work function than the first material 172'. For example, if the RAD antifuse 170' illustrated in FIG. 4 is used with an n-doped channel device, the second material 174' may include a p-doped polysilicon material and the first material 172' may include an n-doped polysilicon material. Other materials having differing work functions may also be used to form RAD antifuse 170' according to embodiments of the invention.

As with other embodiments of the invention, materials used to form the first material 172' and second material 174' may include materials such as polysilicon, doped polysilicon, metals, and metal alloys.

Figure 5A:
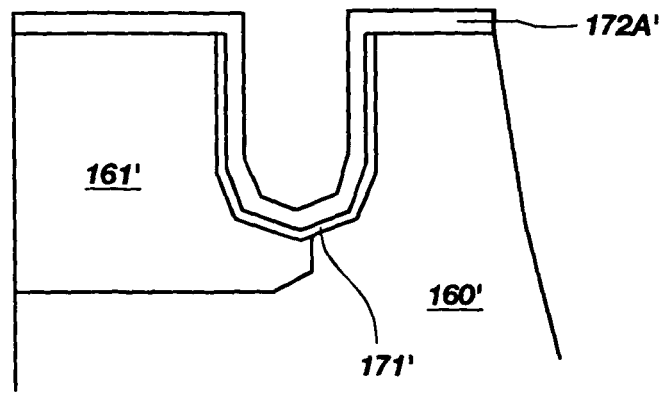
FIGS. 5A-5C illustrate cross-sectional views of various process steps in the fabrication of the recessed access device antifuse illustrated in FIG. 4 according to embodiments of the invention.
Figure 5B:
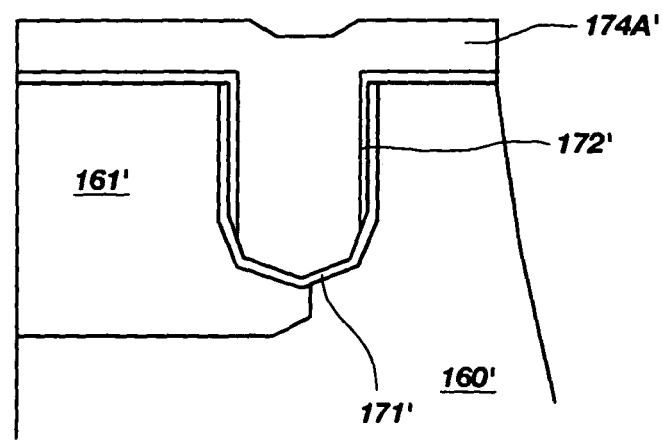
Figure 5C:
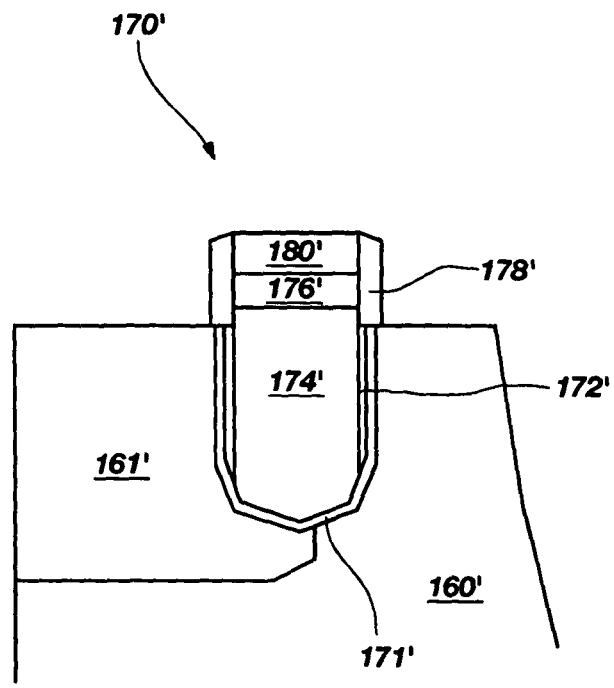

The RAD antifuse 170' of embodiments of the invention may be produced using fabrication processes used to form conventional semiconductor devices and particularly memory devices. For example, the RAD antifuse 170' illustrated in FIG. 4 may be formed using conventional CMOS or memory device fabrication processes similar to the steps illustrated in FIGS. 5A-5C. As illustrated in FIG. 5A, a semiconductor substrate 160' having trenches formed therein may be provided. Oxide 171' may be grown or deposited in the trenches in a manner similar to conventional RAD structures. A first material layer 172A', such as polysilicon, may be deposited over the semiconductor substrate 160' and in the trenches. The first material layer 172A' may be doped according to conventional doping techniques if desired. An anisotropic spacer etch selective to the oxide 171' may be performed to remove the first material layer 172A' in the bottom of a trench, leaving the first material 172' on the sidewalls of the trench as illustrated in FIG. 5B. A second material layer 174A' formed of a material having a higher work function than the first material 172' may be deposited over the substrate 160' and in the trenches as illustrated in FIG. 5B. Masking and/or etching of the second material layer 174A' may be used to form the second material 174' as illustrated in FIG. 5C. The second material 174' may also be doped using conventional processes as desired. Conventional masking, etching, doping, and deposition processes may be used to complete the formation of a RAD antifuse 170', including the formation of a strap 176', formation of insulator caps 180', and formation of sidewall spacers 178' as illustrated in FIG. 4. Active areas 162' may also be formed in the semiconductor substrate 160' according to conventional methods.

Although particular methods for forming the RAD antifuse 170' of certain embodiments of the invention are illustrated in FIGS. 5A-5C, it is understood that other methods and processes may also be used to fabricate RAD antifuse 170' according to embodiments of the invention.

Figure 6:
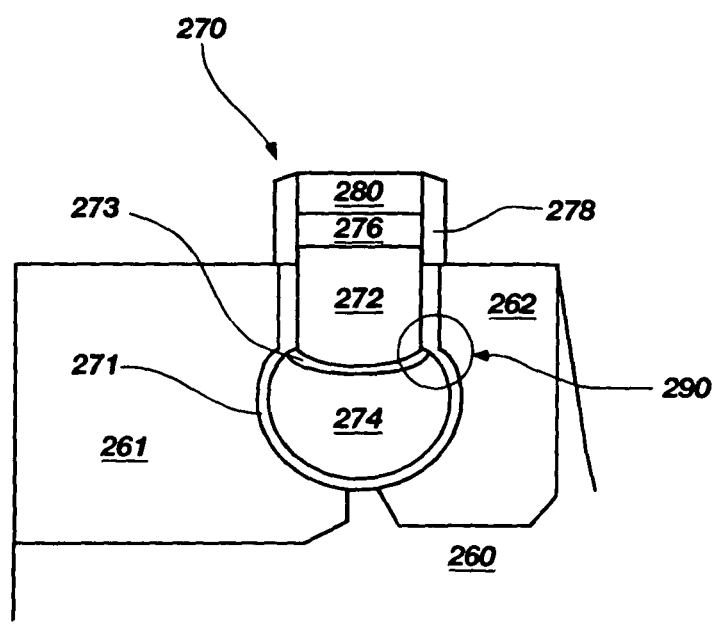
FIG. 6 illustrates a cross-sectional view of a spherical recessed access device antifuse according to embodiments of the invention.

Spherical recessed access devices (SRAD) may also be used as antifuses according to other embodiments of the invention. For example, an SRAD antifuse 270 according to particular embodiments of the invention is illustrated in FIG. 6. The SRAD antifuse 270 may include the same characteristics as RAD antifuses 170 of embodiments of the invention and may be formed using similar processes. However, as illustrated in FIG. 6, the difference between the SRAD antifuse 270 and the RAD antifuse 170 is the partially or substantially spherically shaped bottom portion of the SRAD antifuse 270.

The SRAD antifuse 270 illustrated in FIG. 6 is formed in a trench of a semiconductor substrate 260 and may be positioned between active areas 262, such as between source and drain regions of semiconductor devices, or between source and drain regions and shallow trench isolation (STI) regions 262 as illustrated in FIG. 6. The trench in an SRAD antifuse 270 configuration includes a partially spherical or substantially spherical opening in the bottom of the trench as known with conventional spherical recessed access devices. As with other embodiments of the invention, the trench of an SRAD antifuse 270 may be lined with an oxide 271 material. A first material 272 may overlie a second material 274 in the trench of the semiconductor substrate 260. The first material 272 and the second material 274 may be separated by a barrier 273 as illustrated in FIG. 6.

The SRAD antifuses 270 according to particular embodiments of the invention may also include a gate over the first material 272. The gate may include strap layers 276, insulator caps 280, and sidewall spacers 278 as desired. For example, the SRAD antifuse 270 illustrated in FIG. 6 includes a strap layer 276 overlying the first material 272. An insulator cap 280 overlies the strap layer 276 and is in contact with sidewall spacers 278. Strap layers 276, insulator caps 280, and sidewall spacers 278 utilized with SRAD antifuses 270 according to embodiments of the invention may be formed using the same materials and procedures that are used to form similar structures for the RAD antifuses 170 according to embodiments of the invention.

The first material 272 and second material 274 used to form SRAD antifuses 270 according to embodiments of the invention may be formed of materials having different work functions. For instance, the first material 272 may have a lower work function than the second material 274; in an n-channel device, the second material 274 may include a p-type doped polysilicon material while the first material 272 may include an n-type doped polysilicon material, providing a first material 272 with a lower work function than the second material 274. Other materials may also be used to form the materials of the SRAD antifuse 270 according to various embodiments of the invention.

Figure 7A:
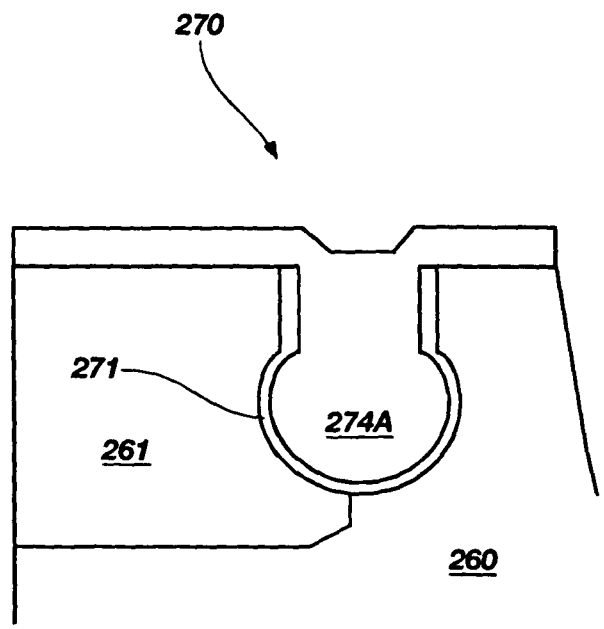
FIGS. 7A-7D illustrate cross-sectional views of various process steps in the fabrication of the spherical recessed access device antifuse illustrated in FIG. 6 according to embodiments of the invention.
Figure 7B:
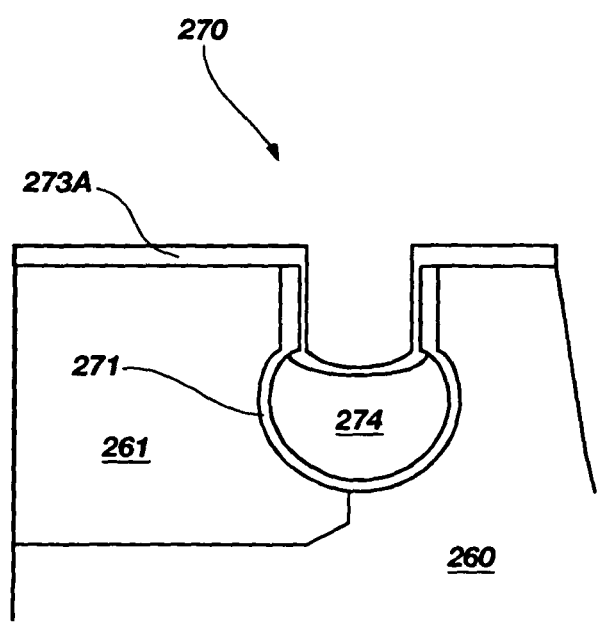
Figure 7C:
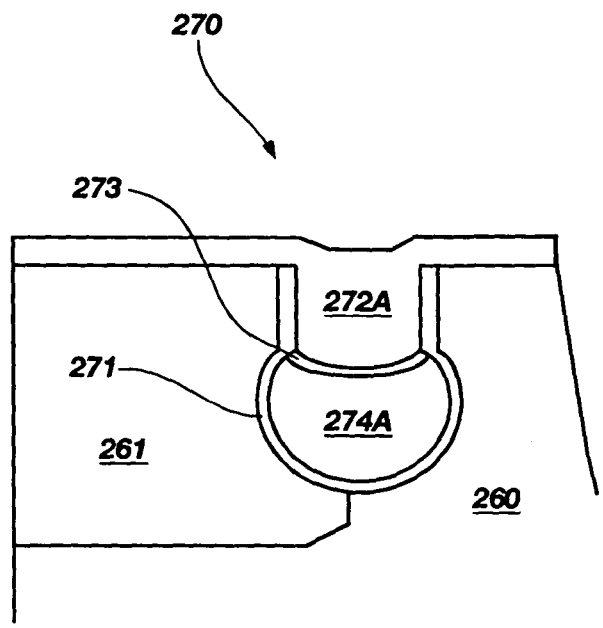
Figure 7D:
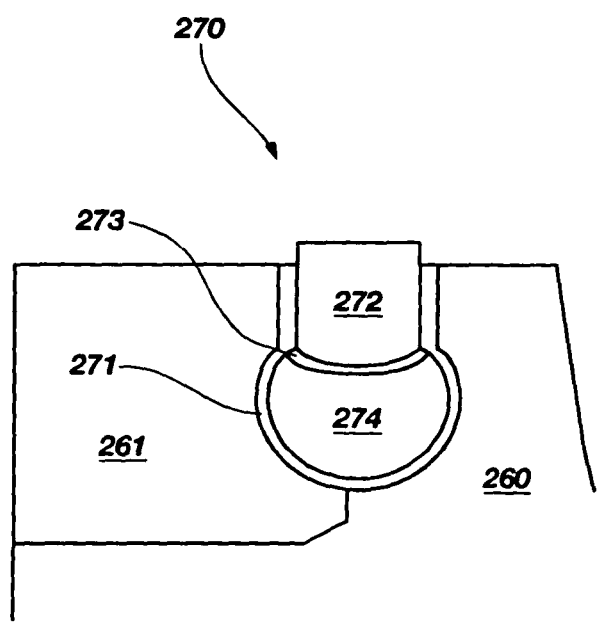

The SRAD antifuse 270 illustrated in FIG. 6 may be produced using fabrication processes used to form conventional SRAD structures in semiconductor devices, and particularly in memory devices. One process that may be used to fabricate the SRAD antifuse 270 illustrated in FIG. 6 is similar to conventional CMOS or memory device fabrication processes and is illustrated in FIGS. 7A-7D. As illustrated in FIG. 7A, a semiconductor substrate 260 having one or more trenches with partially spherical or substantially spherical bottom trench portions may be provided. The trenches may be formed next to or in part of a shallow trench isolation region 261 or in proximity to regions in the semiconductor substrate 260 which may be formed into active areas (not shown). An oxide 271 layer may be grown or deposited in a trench using conventional oxide formation processes. A second material layer 274A, such as a polysilicon layer, may be deposited over the semiconductor substrate 260 and in the trench. Masking and/or etching of the second material layer 274A may be performed to form a second material 274 within the trench as illustrated in FIG. 7B. The masking and/or etching may be controlled such that a desired amount of second material 274 remains in the trench. A barrier layer 273A may be deposited over the second material 274 and the semiconductor substrate 260. Masking and/or etching of the barrier layer 273A may form barrier 273 over the second material 274 in a spherical trench as illustrated in FIG. 7C. A first material layer 272A, such as polysilicon, may be deposited over the semiconductor substrate 260 and in the trench over the barrier 273 as illustrated in FIG. 7C. Masking and/or etching of the first material layer 272A may form the first material 272 as illustrated in FIG. 7D. The masking and/or etching of the first material layer 272A may be performed such that a portion of the first material 272 extends above a surface of the semiconductor substrate 260. Conventional masking, etching, doping, and deposition processes may be used to complete the formation of the SRAD antifuse 270, including the formation of strap layers 276, insulator caps 280 and sidewall spacers 278 if desired. Doping of the semiconductor substrate 260 to form one or more active areas 262 may also be performed as desired.

Although a fabrication method for SRAD antifuse 270 devices is illustrated in FIGS. 7A-7D, it is understood that other methods and processes may also be used to fabricate SRAD antifuses 270 according to embodiments of the invention.

The utilization of multi-work function materials to fabricate the SRAD antifuses 270 according to embodiments of the invention may provide improved breakdown areas 290 in the SRAD antifuse 270. As illustrated in FIG. 6, an SRAD antifuse 270 may include one or more likely breakdown areas 290 represented by the circled areas in FIG. 6. One likely breakdown area 290 occurs at the intersection between the first material 272 and the second material 274 with the oxide 271 or at the intersection of the two materials with the barrier 273 and the oxide 271, next to the active area 262. The likely breakdown area 290 for the SRAD antifuse 270 occurs because of the disruption in the oxide 271 that occurs at the intersection of the first material 272 and the second material 274 with or without a barrier 273.

As illustrated in FIG. 6, the intersection between the first material 272 and the second material 274 with the oxide 271 occurs at the pinched region of the SRAD antifuse 270 trench where the partially spherical bottom portion of the trench meets with the upper portion of the trench. Even if the first material 272 and second material 274 of an SRAD antifuse 270 do not meet at the pinched region of the SRAD antifuse 270, the pinched region itself may create a likely breakdown area 290 for the SRAD antifuse 270.

Figure 8:
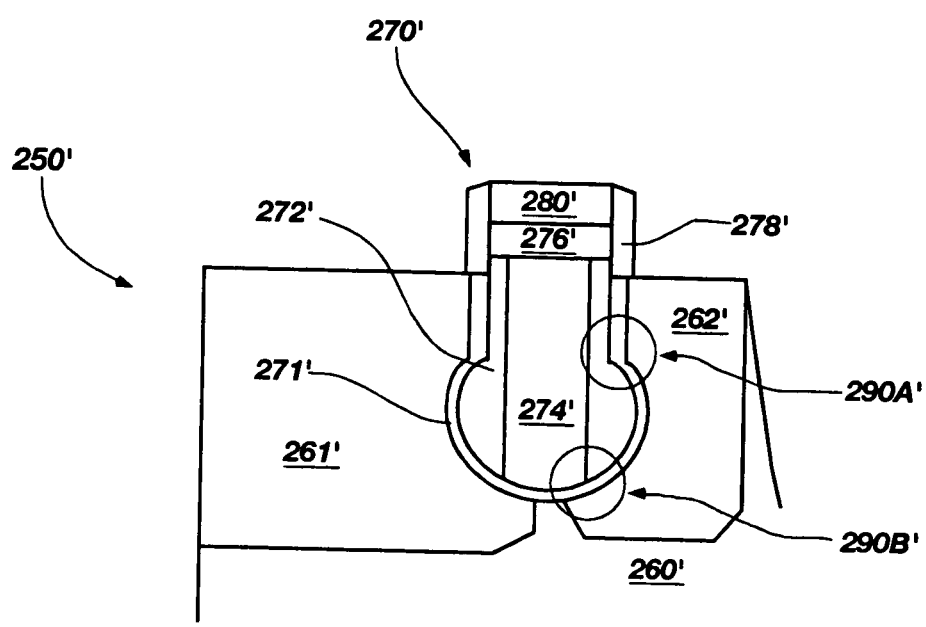
FIG. 8 illustrates a cross-sectional view of a spherical recessed access device antifuse according to embodiments of the invention.

According to other embodiments of the invention, an antifuse device 250' having one or more SRAD antifuses 270' with two or more materials having different work functions may include an SRAD antifuse 270' having a first material 272' positioned along at least a portion of the sidewalls of a partially spherically shaped trench in a semiconductor substrate 260' and a second material 274' at least partially surrounded by the first material 272' as illustrated in FIG. 8. As with other embodiments of the invention, trenches in a semiconductor substrate 260' may include an oxide 271' layer on the sidewalls and in the bottom of the trenches. The first material 272' may be positioned along at least a portion of the oxide 271' layer and the second material 274' may be positioned in an interior portion of the trenches with respect to the first material 272', or in an opening in the first material 272', as illustrated. In some embodiments, a barrier layer (not shown) may be formed between the first material 272' and the second material 274'. The SRAD antifuse 270' may also include a gate overlying the first material 272' and the second material 274'. The gate may include a strap 276' overlying the first material 272' and second material 274' and an insulator cap 280' overlying the strap 276'. Sidewall spacers 278' may also be formed with the SRAD antifuse 270' as desired. The SRAD antifuse 270' may be positioned between active areas 262', such as between source and drain regions of memory devices, or between a source or drain region active area 262' and a shallow trench isolation region 261' as illustrated in FIG. 8.

The SRAD antifuse 270' illustrated in FIG. 8 includes at least two likely breakdown areas 290A', 290B'. A first likely breakdown area 290A' occurs at the intersection of the first material 272' and the second material 274' with the oxide 271' in proximity to the active area 262'. A second likely breakdown area 290B' occurs at the pinched section of the SRAD antifuse 270' trench where the partially spherical bottom portion of the trench meets with the upper portion of the trench as illustrated in FIG. 8. The first likely breakdown area 290A' is a likely point for SRAD antifuse 270' breakdown because of the disruption of the oxide 271' caused by the intersection of the first material 272' and the second material 274' within the first likely breakdown area 290A'. The second likely breakdown area 290B' may be more likely to breakdown under high voltage due to the different thicknesses of the first material 272' converging within the second likely breakdown area 290B' in the SRAD antifuse 270'.

According to embodiments of the invention, the second material 274' of the SRAD antifuse 270' may be formed of a material having a higher work function than the first material 272'. For example, in an n-channel device, the second material 274' used to form the SRAD antifuse 270' illustrated in FIG. 8 may include a p-doped polysilicon material and the first material 272' may include an n-doped polysilicon material. Other materials having differing work functions may also be used to form SRAD antifuse 270' according to embodiments of the invention.

Figure 9A:
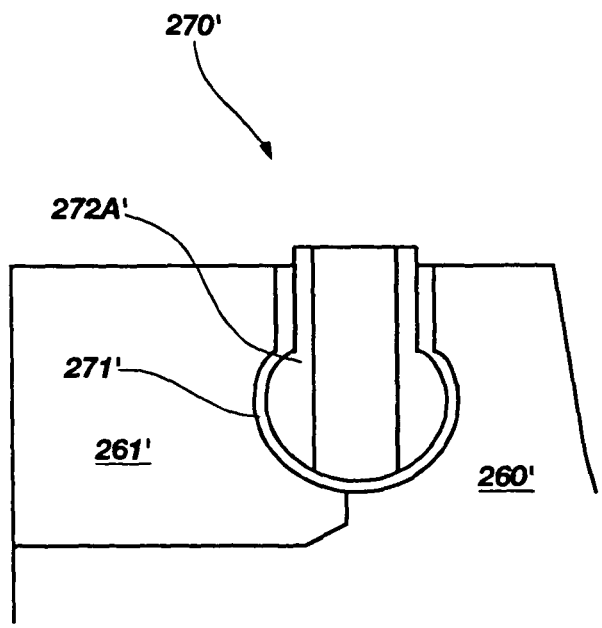
FIGS. 9A-9C illustrate cross-sectional views of various process steps in the fabrication of the spherical recessed access device antifuse illustrated in FIG. 8 according to embodiments of the invention.
Figure 9B:
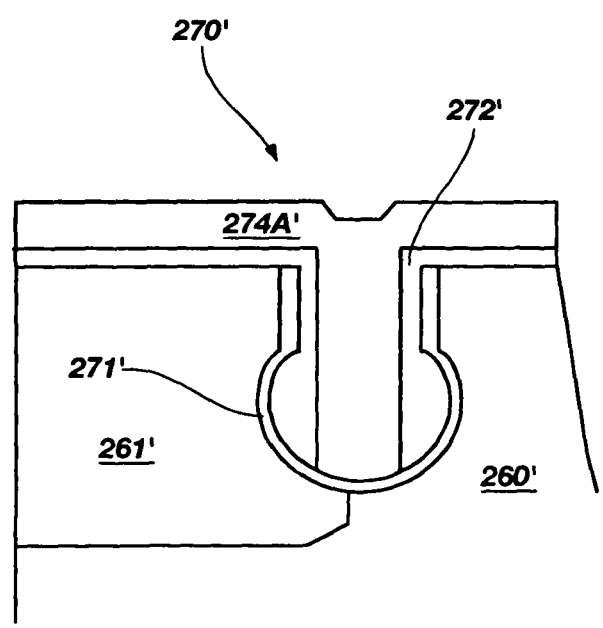
Figure 9C:
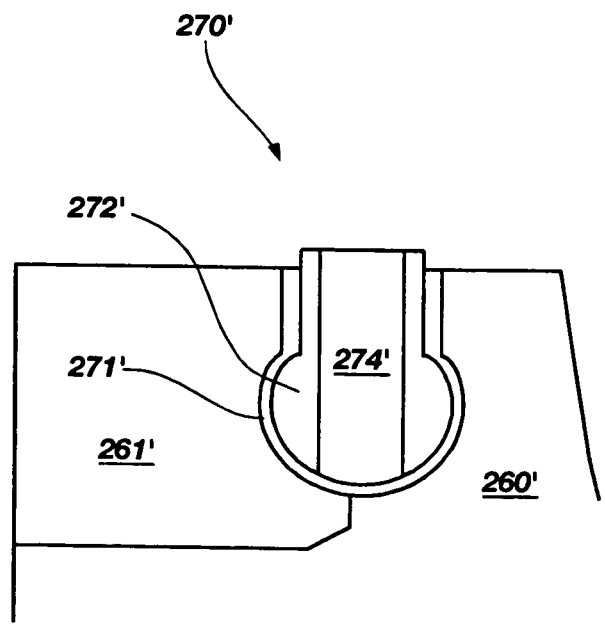

The SRAD antifuse 270' of embodiments of the invention may be produced using fabrication processes used to form conventional semiconductor devices and particularly memory devices. For example, the SRAD antifuse 270' illustrated in FIG. 8 may be formed using conventional CMOS or memory device fabrication processes similar to the steps illustrated in FIGS. 9A-9C. As illustrated in FIG. 9A, a semiconductor substrate 260' having partially spherically shaped trenches formed therein may be provided. Oxide 271' may be grown or deposited in the trenches as with conventional SRAD structures. A first material layer 272A' may be deposited over the semiconductor substrate 260' and in the trenches. The first material layer 272A' may be doped according to conventional doping techniques. An anisotropic spacer etch selective to the oxide 271' may be performed to remove the first material layer 272A' in the bottom of a trench, leaving the first material 272' on the sidewalls of the trench as illustrated in FIG. 9B. A second material layer 274A' may be deposited over the substrate 260' and in the trenches as illustrated in FIG. 9B. The second material layer 274A' may be doped according to conventional methods as desired. Masking and/or etching of the second material layer 274A' may be used to form the second material 274' as illustrated in FIG. 9C; the second material 274' having a higher work function than the first material 272'. Conventional masking, etching, doping, and deposition processes may be used to complete the formation of an SRAD antifuse 270', including the formation of a strap 276', formation of insulator caps 280', and formation of sidewall spacers 278' as illustrated in FIG. 8. Active areas 262' may also be formed in the semiconductor substrate 260' according to conventional methods.

Although methods for forming an SRAD antifuse 270' according to particular embodiments of the invention are illustrated in FIGS. 9A-9C, it is understood that other methods and processes may also be used to fabricate SRAD antifuses 270' according to embodiments of the invention.

Figure 10:
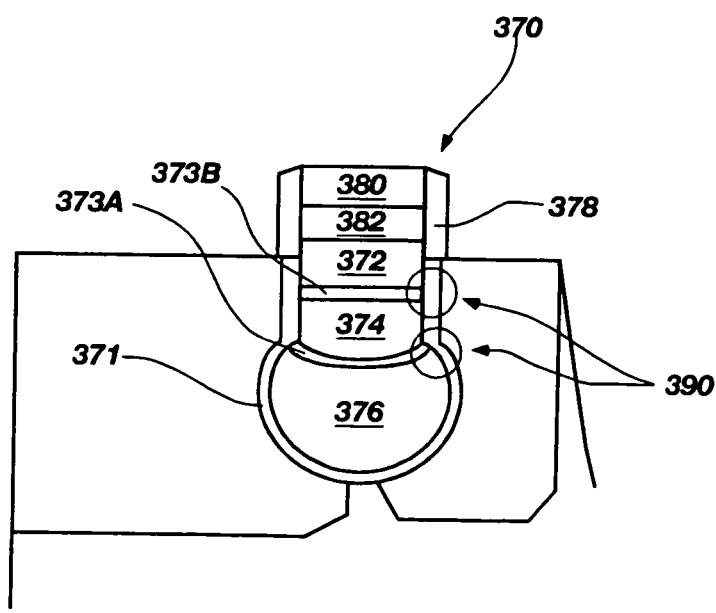
FIG. 10 illustrates a cross-sectional view of a spherical recessed access device antifuse according to embodiments of the invention.

While the RAD antifuses and SRAD antifuses illustrated in FIGS. 1, 4, 6, and 8 each include two material layers, it is understood that in other particular embodiments of the invention, the RAD antifuses and SRAD antifuses may include two or more layers of different materials. For example, an SRAD antifuse 370 similar to that illustrated in FIG. 6 is illustrated in FIG. 10. The SRAD antifuse 370 may include an oxide 371 in a spherically shaped trench and three different materials (372, 374, and 376) layered one on top of one another with barriers 373A and 373B positioned between each of the layers of materials. The SRAD antifuse 370 may also include a strap 382, an insulator cap 380, and sidewall spacers 378. The inclusion of an additional material layer may provide an additional likely breakdown area 390 for the SRAD antifuse 370, where the likely breakdown areas 390 include the intersection of a first material 372 and second material 374 with optional barrier 373B and the intersection of the second material 374 and third material 376 with the optional barrier 373A.

According to particular embodiments of the invention, the various configurations of RAD antifuses and SRAD antifuses utilize materials having different work function values. In some embodiments, the difference in work function between the materials used to form the antifuses may be on the order of between about 0.2 eV and about 0.5 eV or more. In some embodiments, lower work function materials having work function values of about 4.4 eV or less may be utilized to form a low work function material while higher work function materials having work function values of about 4.6 eV or more may be used to form a high work function material. For example, low work function materials which may be used with embodiments of the invention may include, but are not limited to, materials such as polysilicon, doped polysilicon, metal, and metal alloys having work function values of about 4.4 eV or less. High work function materials which may be used with embodiments of the invention may include, but are not limited to, materials such as polysilicon, doped polysilicon, metals, and metal alloys having work function values of about 4.6 eV or more.

Other materials that may be used as low or high work function materials with embodiments of the invention include, but are not limited to, titanium nitride (TiN), nickel-silicon (NiSi), and ruthenium-tantalum ($Ru_xTa_y$). In the case of ruthenium-tantalum, x and y are selected to achieve a desired work function value for the material. For example, a $Ru_xTa_y$ high work function material may be produced by selecting x and y so that the work function value of the material is about 5.0 eV. In other embodiments, x and y for the $Ru_xTa_y$ material may be selected to produce a low work function material having a work function value of about 4.2 eV.

Figure 11:
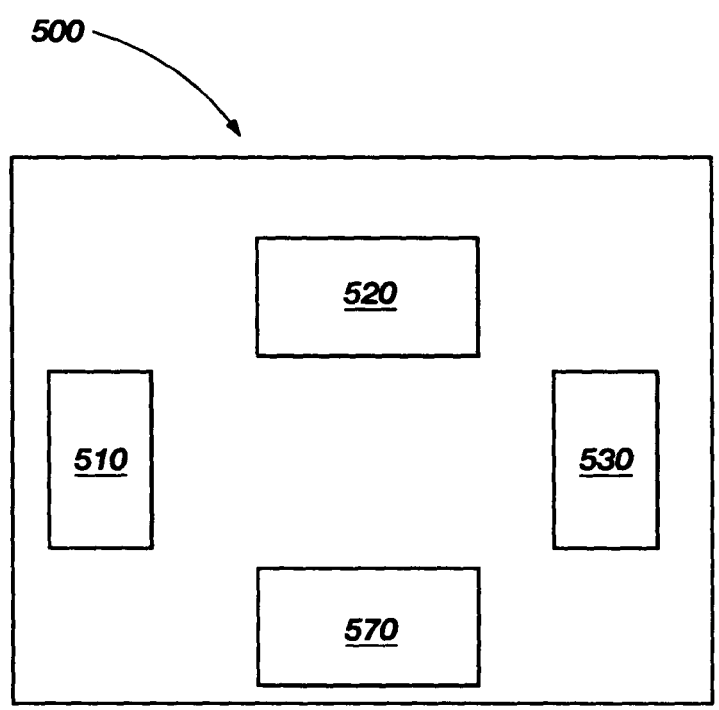
FIG. 11 illustrates a top-down view of an integrated circuit device employing a recessed access device antifuse according to embodiments of the invention.

The multi-work function RAD antifuses and SRAD antifuses according to embodiments of the invention may be used with various integrated circuit devices and semiconductor devices. In some embodiments, the RAD antifuses and SRAD antifuses may be tailored such that the location of a breakdown in the antifuse may be controlled. For example, FIG. 11 illustrates a top-down view of a portion of an integrated circuit 500 having a stub-antifuse 570 and a series of contacts; in particular, a first contact 510, a second contact 520, and a third contact 530. The stub-antifuse 570 may include a RAD antifuse or SRAD antifuse according to embodiments of the invention. Application of a voltage difference between the stub-antifuse 570 and one or more of the contacts may lead to the breakdown of the stub-antifuse 570 in the direction of one or more of the contacts. Breakdown of the stub-antifuse 570 with respect to one of the contacts allows current to flow between the stub-antifuse 570 and the respective contact. For instance, if a voltage difference sufficient to cause a breakdown in the stub-antifuse 570 is applied to the stub-antifuse 570 and the first contact 510, the stub-antifuse 570 may breakdown with respect to the first contact 510, forming a conductive path between the stub-antifuse 570 and the first contact 510. In another instance, if a voltage difference sufficient to cause a breakdown in the stub-antifuse 570 is applied between the stub-antifuse 570 and the second contact 520 and between the stub-antifuse 570 and the third contact 530, breakdown of the stub-antifuse 570 with respect to those two contacts may occur. Such breakdown creates a conductive path between the stub-antifuse 570 and the second contact 520 and third contact 530.

Utilizing RAD antifuses and SRAD antifuses according to embodiments of the invention as a stub-antifuse 570 may help control the breakdown path of the stub-antifuse 570. In particular, a RAD antifuse or SRAD antifuse according to embodiments of the invention may be selected and positioned with respect to one or more contacts such that conductive paths between the one or more contacts and the antifuse may be created based upon the likely breakdown areas of the RAD antifuse or SRAD antifuse being used.

In still other embodiments of the invention, the RAD devices and SRAD devices describe in U.S. patent application Ser. No. 11/432,442, entitled "MEMORY CELL ACCESS DEVICES AND METHODS OF MAKING THE SAME," and filed May 11, 2006, now abandoned, and in U.S. patent application Ser. No. 11/432,270, entitled "DUAL WORK FUNCTION RECESSED ACCESS DEVICE AND METHODS OF FORMING," filed May 11, 2006, now U.S. Pat. No. 8,008,144, issued Aug. 30, 2011, the disclosures of which are incorporated herein by reference in their entirety, may also be adapted for use as antifuses with integrated circuits and semiconductor devices.

Having thus described certain currently preferred embodiments of the present invention, it is understood that the invention defined by the appended claims is not to be limited by particular details set forth in the above description, as many apparent variations thereof are contemplated without departing from the spirit or scope thereof as hereinafter claimed.

What is claimed is:

1. A recessed access device antifuse, comprising:
a trench in a semiconductor substrate and comprising:
an upper portion comprising opposing vertical sidewalls; and
an at least partially spherically shaped bottom portion extending beyond lateral boundaries of the upper portion of the trench; a bottom portion comprising at least one curved surface; an insulative material lining the trench; a first material in the trench and isolated from the semiconductor substrate by the insulative material, a portion of the first material extending below a surface of the semiconductor substrate and another portion of the first material extending above the surface of the semiconductor substrate; material;
a second material in the trench and in contact with the insulative material and the first material in the trench, the second material confined within lateral boundaries of at least one of the upper portion and the at least partially spherically shaped bottom portion of the trench and electrically isolated from the semiconductor substrate by at least one of the insulative material and the first material, a portion of the second material extending below the surface of the semiconductor substrate and another portion of the second material extending above the surface of the semiconductor substrate, a work function value of the second material higher than a work function value of the first material; and
an antifuse breakdown area in the insulative material, adjacent to a boundary between the first material and the second material.

2. The recessed access device antifuse of claim 1, wherein a difference between the work function value of the first material and the work function value of the second material is greater than or equal to about 0.2 eV.

3. The recessed access device antifuse of claim 1, wherein the work function value of the first material is less than or equal to about 4.4 eV.

4. The recessed access device antifuse of claim 1, wherein the work function value of the second material is greater than or equal to about 4.6 eV.

5. The recessed access device antifuse of claim 1, wherein the first material comprises at least one of polysilicon, doped polysilicon, metals, metal alloys, titanium nitride, nickel-silicon, and ruthenium-tantalum.

6. The recessed access device antifuse of claim 1, wherein the second material comprises at least one of polysilicon, doped polysilicon, metals, metal alloys, titanium nitride, nickel-silicon, and ruthenium-tantalum.

7. The recessed access device antifuse of claim 1, wherein the first material comprises an n-doped polysilicon material, and wherein the second material comprises a p-doped polysilicon material.

8. The recessed access device antifuse of claim 1, wherein the insulative material comprises an oxide material.

9. The recessed access device antifuse of claim 1, wherein the recessed access device antifuse is positioned between laterally spaced active areas in the semiconductor substrate.

10. The recessed access device antifuse of claim 1, wherein the insulative material is confined within the trench.

11. An antifuse, comprising:
a spherical recessed access device comprising:

a trench in a semiconductor substrate, a bottom portion of the trench being at least partially spherical shaped and extending beyond lateral boundaries of opposing vertical surfaces of the trench;

an oxide material over at least a portion of a surface of the trench;

a first material within the trench and contacting at least a portion of the oxide material;

a second material within the trench and contacting portions of the oxide material and the first material within the trench, the second material confined within the lateral boundaries of the opposing vertical surfaces of the trench and at least partially located in a space extending through the first material;

a gate overlying the first material and the second material;

a breakdown area in the oxide material of the recesses access device, adjacent to an intersection of the first material and the second material.

12. The antifuse of claim 11, wherein the spherical recessed access device is positioned between laterally spaced active areas in the semiconductor substrate.

13. The antifuse of claim 11, wherein the spherical recessed access device is positioned between an active area and a shallow trench isolation area in the semiconductor substrate.

14. The antifuse of claim 11, wherein the second material exhibits a work function higher than that of the first material.

15. The antifuse of claim 11, wherein the gate further comprises:

a strap material over the first material and the second material;

an insulator cap over the strap material; and at least one sidewall spacer surrounding at least a portion of the strap material and the insulator cap.

16. The antifuse of claim 11, wherein a work function value of the first material is at least 0.2 eV less than a work function value of the second material.

17. The antifuse of claim 11, wherein the first material comprises at least one of polysilicon, doped polysilicon, metals, metal alloys, titanium nitride, nickel-silicon, and ruthenium-tantalum.

18. The antifuse of claim 11, wherein a work function value of the first material is less than or equal to about 4.4 eV.

19. The antifuse of claim 11, wherein the second material comprises at least one of polysilicon, doped polysilicon, metals, metal alloys, titanium nitride, nickel-silicon, and ruthenium-tantalum.

20. The antifuse of claim 11, wherein a work function value of the second material is greater than or equal to about 4.6 eV.

* * * * *

UNITED STATES PATENT AND TRADEMARK OFFICE
CERTIFICATE OF CORRECTION

PATENT NO.       : 8,860,174 B2                                    Page 1 of 1
APPLICATION NO.  : 11/495805
DATED            : October 14, 2014
INVENTOR(S)      : Casey Smith et al.

It is certified that error appears in the above-identified patent and that said Letters Patent is hereby corrected as shown below:

In the Claims

In column 12, lines 13-14, in Claim 1, after "trench;" delete "a bottom portion comprising at least one curved surface;".

In column 12, line 20, in Claim 1, after "substrate;" delete "material;".

In column 14, line 2, in Claim 14, after "function" insert -- value --.

Signed and Sealed this
Twenty-third Day of December, 2014

Michelle K. Lee
*Deputy Director of the United States Patent and Trademark Office*